United States Patent [19]
Mundinger et al.

[11] Patent Number: 5,453,641
[45] Date of Patent: Sep. 26, 1995

[54] WASTE HEAT REMOVAL SYSTEM

[75] Inventors: David C. Mundinger, Dublin; Donald R. Scifres, San Jose, both of Calif.

[73] Assignee: SDL, Inc., San Jose, Calif.

[21] Appl. No.: 93,206

[22] Filed: Jul. 16, 1993

Related U.S. Application Data

[63] Continuation-in-part of Ser. No. 992,127, Dec. 16, 1992, abandoned.

[51] Int. Cl.$^6$ .............................. H01L 25/04; H01L 23/02
[52] U.S. Cl. .................... 257/714; 257/712; 361/689; 361/699; 361/700; 165/104.21; 165/104.26; 165/104.33
[58] Field of Search .................... 257/712, 713, 257/714, 715; 372/35; 165/104.26, 104.33; 361/700

[56] References Cited

U.S. PATENT DOCUMENTS

| | | | |
|---|---|---|---|
| 4,212,349 | 7/1980 | Andros et al. | 257/715 |
| 4,758,926 | 7/1988 | Herrell et al. | 361/699 |
| 4,791,634 | 12/1988 | Miyake | 372/34 |
| 4,894,709 | 1/1990 | Phillips et al. | 257/714 |
| 4,953,634 | 9/1990 | Nelson et al. | 361/699 |
| 5,002,122 | 3/1991 | Sarraf et al. | 165/104.26 |
| 5,005,640 | 4/1991 | Lapinski et al. | 257/714 |
| 5,099,311 | 3/1992 | Bonde et al. | 361/699 |
| 5,105,429 | 4/1992 | Mundinger et al. | 257/714 |
| 5,105,430 | 4/1992 | Mundinger et al. | 372/35 |
| 5,126,829 | 6/1992 | Daikoku et al. | 257/714 |
| 5,131,233 | 7/1992 | Cray et al. | 257/715 |
| 5,179,500 | 1/1993 | Koubek et al. | 257/714 |
| 5,262,673 | 11/1993 | Mikoshiba et al. | 257/714 |

FOREIGN PATENT DOCUMENTS

| | | | |
|---|---|---|---|
| 251836 | 1/1988 | European Pat. Off. | 257/714 |
| 63-083587 | 4/1988 | Japan | 165/104.26 |
| 63-76462 | 4/1988 | Japan | 257/714 |
| 4152659 | 5/1992 | Japan | 257/714 |
| 892182 | 12/1981 | U.S.S.R. | 165/104.26 |
| 1449825 | 1/1989 | U.S.S.R. | 165/104.26 |

OTHER PUBLICATIONS

IBM TDB, vol. 20, No. 11A, Apr. 1978, Liquid Cooling of a Multichip Module Package, pp. 4336–4337.
IBM TDB, vol. 20, No. 9, Feb. 1978, Liquid Jet Cooling of IC Chips, pp. 3727–3728.

*Primary Examiner*—Rolf Hille
*Assistant Examiner*—T. M. Arroyo
*Attorney, Agent, or Firm*—Schneck & McHugh

[57] ABSTRACT

A cooling device formed in a thermally conductive substrate having at least one microchannel of dimensions that induce capillary action and a surface in thermal contact with a heated region. The microchannel has a longitudinal opening oriented away from the heated region and is supplied with liquid coolant which is contained by a meniscus near the opening. The coolant vaporizes at the meniscus and absorbs heat but, due to increased pressure in the coolant contained by the meniscus, does not boil within the microchannel, allowing more liquid coolant contact with the thermally conductive substrate and walls. The vaporized coolant is discharged into a chamber facing the opening which can be at a lower pressure to remove additional heat by gaseous expansion. The discharge of gaseous coolant allows the capillary flow of the liquid coolant in the microchannels to be unimpeded, and may be augmented by a fluid pump. The gaseous coolant may be in thermal contact with a condenser that liquefies the coolant for supply to the microchannels, by an array of capillaries, in a self contained cooling device. An array of such devices is provided with holes and stacked to connect adjacent liquid and gaseous coolant flows to cool an array of heated objects, such as laser diode bars.

34 Claims, 6 Drawing Sheets

WASTE HEAT REMOVAL SYSTEM

CROSS REFERENCE TO RELATED APPLICATION

This is a continuation-in-part of patent application Ser. No. 07/992,127 filed Dec. 16, 1992, now abandoned.

TECHNICAL FIELD

The present invention pertains to cooling of heated regions. More particularly, the present invention relates to cooling of microelectronic devices such as laser diodes and cooling of arrays of such devices.

BACKGROUND ART

Excess heat is generated in many electrical and mechanical applications. Microprocessors, for example, may generate excess heat through internal electrical resistances. Mechanical devices such as those employing micro-machined gears and components also generate unwanted heat through friction between contacting surfaces. Heat produced by such systems can severely hamper the performance and reliability of the devices. In an attempt to alleviate the problem of excess heat generation, such devices are often soldered onto a heat sink formed of a thermally conductive material such as copper. Although heat sinks are somewhat effective in removing small amounts of heat, as the amount of heat produced is increased, the finite conductivity and diffusivity of the material used as a heat sink becomes a limiting factor. Even for the most thermally conductive materials such as diamond, the rate of heat transfer away from the device is not fast enough to keep up with the rate at which heat is produced. As a result, unacceptable temperature rises occur thereby limiting the performance and reliability of the device.

Microchannel cooling systems have been introduced which use a liquid such as water for cooling a heat source. In such systems, tunnels or grooves are formed into the substrate supporting the heat generating device. A liquid coolant (typically water) is then pumped through the tunnels in an attempt to remove excess heat generated by the device. These systems are designed to get the liquid coolant very close to the heat source, to further facilitate heat removal. However, the tunnels require a high pressure to maintain sufficient flow of the liquid coolant. As the number of tunnels is increased, and the corresponding size of the tunnels is decreased, the frictional forces on the coolant become substantial and, eventually, prohibitive. Furthermore, the performance of the system is still limited by the finite heat capacity of the water and the ability to get the heated coolant or vapor away from the heat source and fresh coolant into the region.

Heat pipes are also a well known method for providing system cooling. Heat pipe systems utilize a porous material such as sintered metal, ceramic, screens, or webbing as a wick to supply liquid coolant to the area from which excess heat is to be removed. The wick draws the coolant into the desired region through capillary pressure. As the coolant in the wick passes near the heat generating device, excess heat is absorbed through warming or, more commonly, vaporization of the coolant. Unfortunately, wick-type cooling systems also suffer from severe drawbacks. As the coolant in the wick is vaporized, increased pressure is created within the wick. The resultant pressure impedes the flow of new coolant through the wick and into the area where it is most needed. Additionally, the vaporized coolant tends to dry out the wick as it moves through it. Often, as the wick dries out, the temperature of the device rises substantially.

Therefore it is an object of this invention to provide for the efficient dissipation of heat from a heated region having the advantages of conventional microchannel and wick-type systems, but which does not have restricted or impeded flow of liquid coolant, and which does not dry out as quickly due to the flow of vaporized coolant through the system.

SUMMARY OF THE INVENTION

This object has been achieved with a compact heat dissipation device utilizing an array of microchannels formed in a thermally conductive substrate at a location near the heated region. The microchannels are of a size that induces capillary action, are continually supplied with a liquid coolant, and are open in a direction away from the heated region, except for a meniscus which forms between opposite walls of the microchannel and helps confine liquid coolant therein. Due to the size and shape of the microchannels, a pressure gradient is formed in the liquid coolant disposed within the microchannels, such that the pressure near the heated region is substantially higher than the pressure further from the heated region, in the meniscus near the opening of the microchannels. In addition, the thermal conductivity of the substrate allows heat to travel through the walls separating the microchannels providing a fairly even heating of the liquid coolant disposed within the microchannels. Due to the combination of pressure gradient and the fairly even temperature distribution within the microchannels, the coolant is prevented from boiling at the high pressure region near the heated region, instead vaporizing only at the meniscus. The change of the coolant phase from a liquid to gaseous state absorbs a significant amount of heat from the heated region, transferring heat to the vapor, while preventing the liquid from boiling near the heated region allows the efficient conduction of heat and prevents the microchannels from drying out.

The opening of a microchannel discharges gaseous coolant into a voluminous chamber. Cooling of the device is augmented by expansion of the gaseous coolant as it flows into the chamber, encouraged by a lower pressure in the chamber than at the opening. The pressure may be reduced in the chamber by a gas pump or by convection caused by a condenser in thermal communication with the chamber. The condenser is maintained at a temperature which liquefies the gaseous coolant in the chamber.

Although any means for supplying liquid coolant to be drawn by capillary action into the microchannels and any separate means for discharging gaseous coolant from the openings of the microchannels can be used with this device, a particular improvement is disclosed which utilizes a second substrate which contains a plurality of passageways and which is bonded to the bottom of the first substrate such that a portion of the passageways are in fluid communication with the microchannel. Liquid coolant is then provided via one or more of the passageways to the microchannels, where it is disposed in close proximity to the heated region through capillary action induced by the microchannel. A preferred means of supplying liquid coolant involves a second array of microchannels feeding fluid to the microchannels that are proximate to the heated region. The coolant is vaporized from the meniscus in the microchannels proximate to the heated region, and the vapor is vented from the those microchannels through one or more different, larger passageways. In so doing, a continuous flow of coolant is provided to the microchannels and the vaporized coolant is removed through a different route so that the flow of coolant to the microchannel array is not impeded.

The heat dissipating devices can be used to cool devices such as laser diodes that are bonded to the thermally conductive substrate. Combinations of a laser diode, a thermally conductive substrate, and a second substrate can be stacked in arrays that are cooled using a single source of liquid coolant and a single repository for gaseous coolant.

As a result, the present invention provides for the dissipation of higher levels of waste heat than was previously possible. This in turn enables higher performance and increased reliability levels in the devices being cooled, such as laser diodes and laser diode arrays.

BEST MODE FOR CARRYING OUT THE INVENTION

Figure 1:
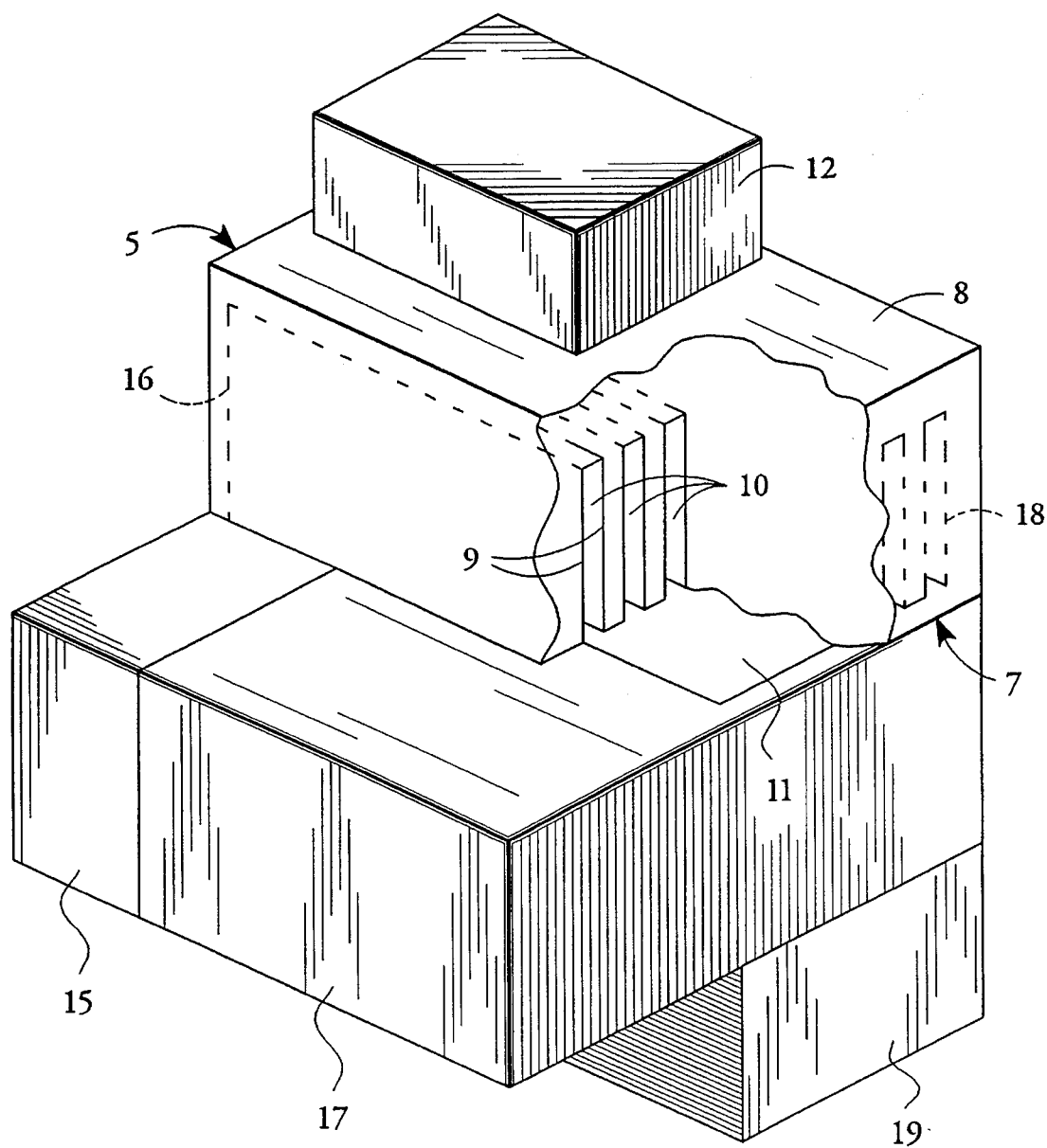
FIG. 1 is a perspective view of a heat dissipation apparatus in accord with the present invention.

With reference to FIG. 1, a perspective view of a preferred embodiment of the heat dissipation apparatus of the present invention is shown. A thermally conductive substrate 5 is shown, with an array of microchannels 10 carved therein. The microchannels 10 have walls 9 spaced sufficiently close to each other to induce capillary action. The microchannels 10 are elongated and have openings 11 only at a bottom 7 of the substrate 5, while a top 8 of the substrate is disposed proximate to a source of heat 12. A fluid source 15 supplies liquid coolant (not shown) to one end 16 of the microchannels 10, and capillary action draws the coolant into the microchannels. The exact form of the fluid source 15 is not essential to the invention. A chamber 17 for discharge of gaseous coolant (not shown) is in gaseous communication with the openings 11 of the microchannels 10. The exact form of the chamber 17 is not essential to the invention.

Vaporization of the coolant, aided by heat from the source of heat 12, occurs in the liquid coolant disposed within the microchannels 10 at a meniscus (not shown) proximate to the openings 11, and the gaseous coolant is removed through the chamber 17. Boiling of the coolant within the microchannels is restrained by the dimensions of the microchannels 10 which induce capillary action. Since boiling of the coolant is inefficient, as it produces gas bubbles which reduce the amount of liquid coolant in close proximity to the source of heat 12, the lack of boiling within the microchannels 10 adds to the cooling ability of the invention.

A condenser 19 may be placed in thermal contact with the gaseous coolant in the chamber, the condenser 19 causing the gaseous coolant to liquefy, the liquefied coolant providing coolant to the fluid source 15.

Another preferred embodiment of the invention (not shown) is identical to the embodiment described above, except that the fluid source 15 is in communication with the microchannels 10 at an end 18 of the microchannels opposite to the end 16, and supplies liquid coolant to ends 16 and 18 simultaneously, while gaseous coolant is discharged from the openings 11 and removed by a chamber 17 located between the ends 16 and 18.

The chamber 17 has a much larger volume than the microchannels 10 in order to accommodate the expansion in volume of the coolant as it changes from a liquid to a gaseous phase. When the gas pressure in the chamber 17 is less than that at the openings, as can be provided with a gas pump or with convection that occurs when the chamber is cooled and gaseous coolant liquefied by the condenser 19, the expansion in volume of the gaseous coolant from that near the openings 11 to that of the chamber 17 provides cooling of the gaseous coolant which carries away additional heat from the microchannels 10.

FIG. 2 shows cross-sectional views of different embodiments of the microchannels 10. In FIG. 2a, microchannels 10 having a rectangular cross-section with openings 11 located below and a source of heat 12 located above, as in FIG. 1, are shown. Disposed within the microchannels is liquid coolant 21 having meniscuses 23 formed at the openings 11. Depending upon factors such as the materials used for the substrate 5 and the coolant 21, the heat flux and the length of the microchannels 10, the microchannels 10 may have a height 25 to width 26 aspect ratio of five or ten to one. The microchannels are separated by thermally conductive sidewalls 27 that may be of similar dimensions. The meniscuses 23 are rounded outward from the microchannels 10 due to a minimization of potential energies of gravitational and surface tension forces acting upon the liquid coolant 21.

Figure 2A:
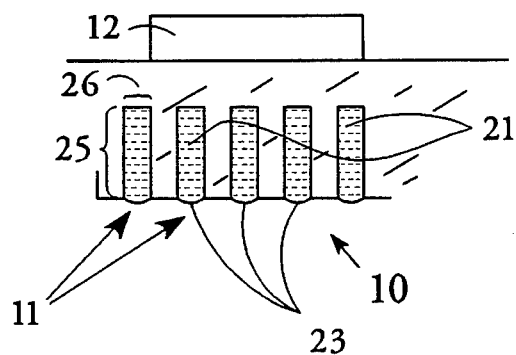
FIGS. 2a–2d is a cross-sectional view of liquid coolant contained by surface tension in several microchannel embodiments.
Figure 2B:
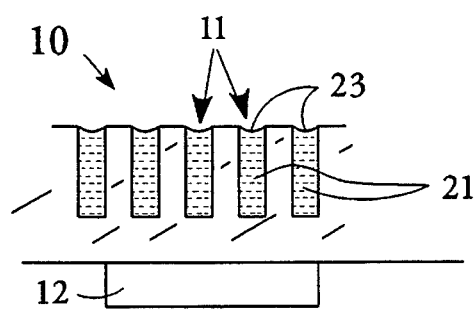
Figure 2C:
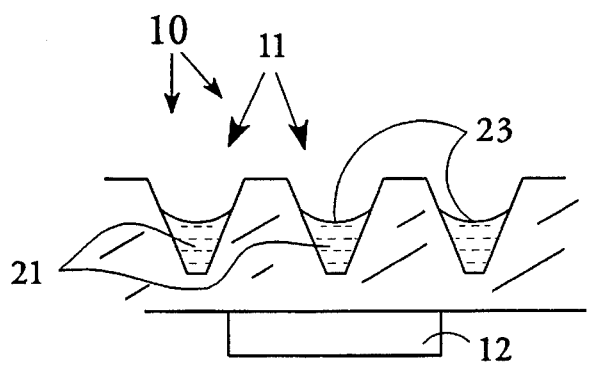
Figure 2D:
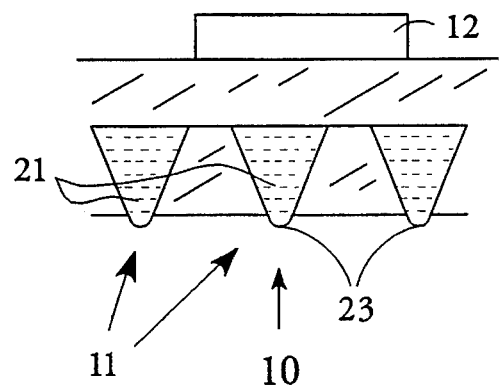

FIG. 2b shows similar microchannels 10, but inverted in position relative to the heat source 12, in which case the meniscuses 23 curve inward into the microchannels 10. FIG. 2c shows microchannels 10 that are V-shaped, with openings 11 that are larger in width 26 than the rest of the microchannels, and having a source of heat 12 below. On the other hand, FIG. 2d shows microchannels 10 with openings 11 below and a source of heat 12 above, but these microchannels 10 have a tapered cross-section, with the openings 11 having the smallest width 26 of the microchannels 10. These variations are useful in increasing the cooling due to expansion of the gaseous coolant and may be produced, for example, by crystallographically selective etching of the silicon substrate 5. It may also be useful to employ microchannels 10 in a non-horizontal position, so that the force of gravity encourages coolant 21 flow along the microchannels 10.

The surface tension of the liquid coolant 21 is strong enough, given the small dimensions of the microchannels 10, to provide the force which both draws the liquid coolant 21 into the microchannels 10 and contains it there. The surface tension that confines the liquid coolant 21 in the microchannels 10 also pressurizes it. Within the meniscuses 23, however, the pressure is diminished, as the meniscuses are free from surface tension in a direction generally away from liquid coolant 21. It is well known that the boiling temperature of a fluid varies directly with pressure. Provided that the temperature within the microchannels 10 is fairly uniform, the liquid coolant 21 will vaporize only at the meniscuses 23, due to the lower pressure and resultant lower boiling point found within the meniscuses 23. In other words, the boiling point gradient of the liquid coolant 21, due to the pressure gradient within the microchannels 10, exceeds the temperature gradient of that coolant 21, causing the coolant 21 to vaporize only at the meniscuses 23.

The temperature within the coolant 21 is generally slightly lower further from the heated region, but sidewalls 27 formed of a thermally conductive material such as silicon conduct heat so much better than a coolant such as water that the temperature gradient of the coolant 21 within the microchannels 10 depends primarily on the thermal conductivity of the substrate 5. The temperature drop between the coolant 21 disposed closest to the heated region and that within the meniscus can be reduced by having either a more thermally conductive substrate 5 or shorter sidewalls 27.

Figure 3:
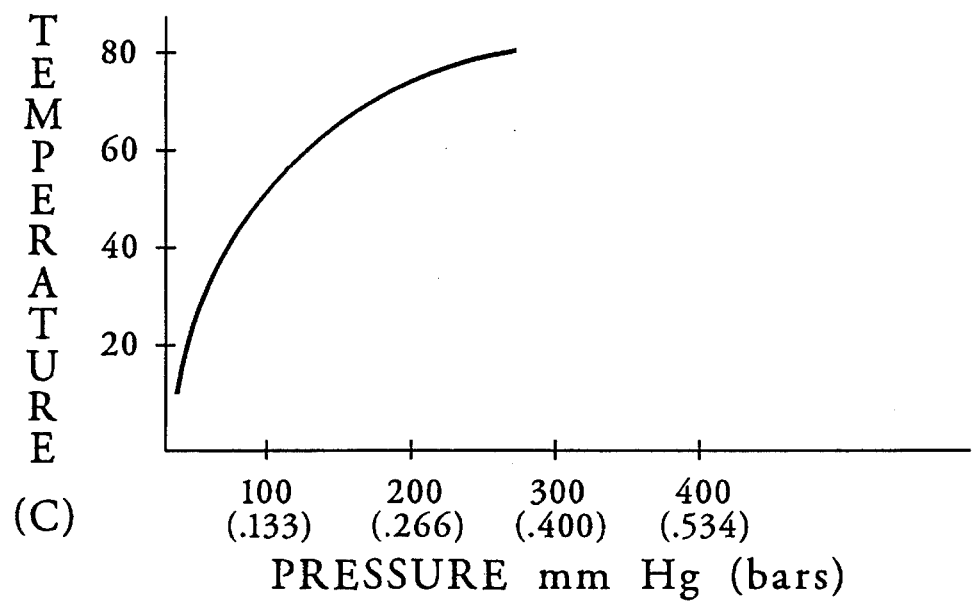
FIG. 3 is a chart of boiling point vs. pressure of water.

The chart of the boiling point vs. pressure of water (FIG. 3) shows a steep slope at low pressures and a shallow slope as the pressure approaches atmospheric (1000 Bars). In order to have a large temperature difference between the boiling point of water in the meniscus 23 and that within the microchannel 10 for a given drop in pressure at the meniscus 23, it is therefore advantageous to operate the device at low pressure. It may also be advantageous to operate the device at low pressure when water is used as the coolant so that phase change cooling takes place at a lower temperature, depending upon the temperature regulation desired.

As a specific example, microchannels 10 separated by vertical silicon sidewalls 27 each having a width of about 10 μm and a height of about 80 μm have been employed with water as the coolant 21. At an operating pressure of 100 Torr, the water will have a boiling point at the meniscus 23 of about 46° C. Inside a microchannel 10 having a width of 10 μm, the hydrostatic pressure of the surface tension will increase the boiling point to about 65°. Provided that the microchannel sidewalls 27 conduct heat well enough to heat the water in the meniscus to at least 46° C. while the water within the channel does not exceed 65° C., the water will vaporize at the meniscus without boiling within the microchannel 10.

Since the vaporization of coolant from the meniscus 23 will cause replacement coolant to be drawn into the microchannels 10 via capillary action, the device acts to regulate temperature by beginning to flow and actively cool the heated region once the temperature in the meniscus 23 reaches the boiling point of the coolant disposed there.

Without the aid of a fluid pump, however, the heat flux that can be cooled by the device depends upon the flow of coolant 21 due to capillary action, which is caused by the surface tension of the coolant 21. The restriction on that flow is due to friction between the walls of the microchannels 10 and the coolant 21 and the viscosity of the coolant 21. For this reason, it is advantageous for the coolant 21 to have a low viscosity and a high surface tension. It is preferable for the liquid coolant to have a viscosity of less than 0.007 poise, a surface tension of at least 70 erg/cm and a heat of vaporization of at least 200 Btu/lb. Fluids such as water, ammonia, freon, alcohol or any other fluid known in the art may be used. Surface tension is more effective at smaller distances, and thus the flow propelled by capillary action, or capillary pressure, increases as the microchannels 10 are reduced in width. The pressure required to overcome friction between the walls of the microchannel 10 and the coolant 21 and to cause coolant to flow also increases exponentially as the width of the microchannels 10 decreases, and increases linearly with the length of the microchannels 10.

To put this in perspective it is useful to look at the heat flux produced by a typical apparatus for which the device is to provide cooling. A laser diode bar operating continuously may produce a heat load of 100 watts. The flow rate (without taking into account any additional cooling provided by expansion of gaseous coolant 21 that does not require additional flow of coolant 21) is simply the heat input divided by the heat of vaporization. Using water again as a convenient example, this implies a flow rate of 0.04 gm/sec to cool the 100 watt load, which may be dispersed over a region 1 mm in length and width.

Figure 4:
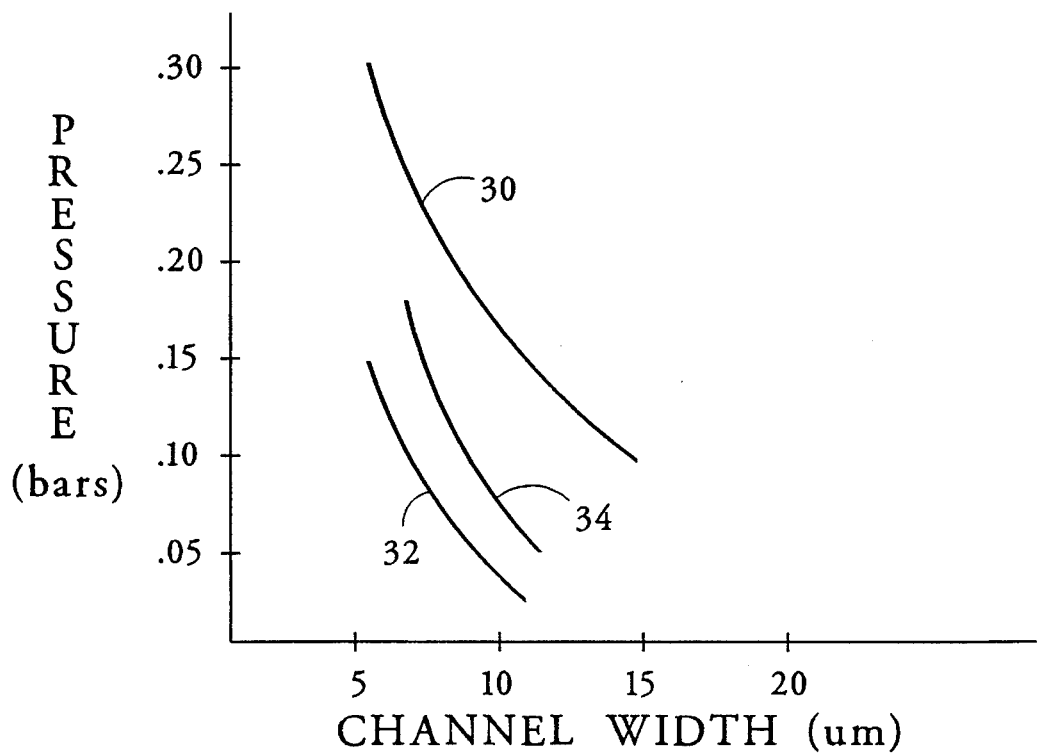
FIG. 4 is a chart of water pressure caused by surface tensions vs. width of the microchannels.

FIG. 4 is a chart of fluid pressure in Bars vs. channel width in μm, for straight microchannels with a rectangular cross-section containing water. The capillary pressure 30 can be seen to increase dramatically as the width of the microchannels decreases. Also shown is a curve graph 32 of the pressure drop associated with a 0.04 gm/sec flow rate for one mm long microchannels 10 of the same cross-section. Curve 34 represents the pressure drop of 2 mm long microchannels of the same cross-section and flow rate. It can be seen, for example, that the capillary pressure of microchannels 10 of width ten μm easily exceeds the pressure drop due to frictional forces.

For moderate heat loads such as that described above, self-pumped or capillary pumped cooling devices are attractive due to their simplicity. For cooling of larger heat loads that cover larger areas, external pumps may augment the flow induced by capillary action of liquid coolant and convection of gaseous coolant.

Figure 5:
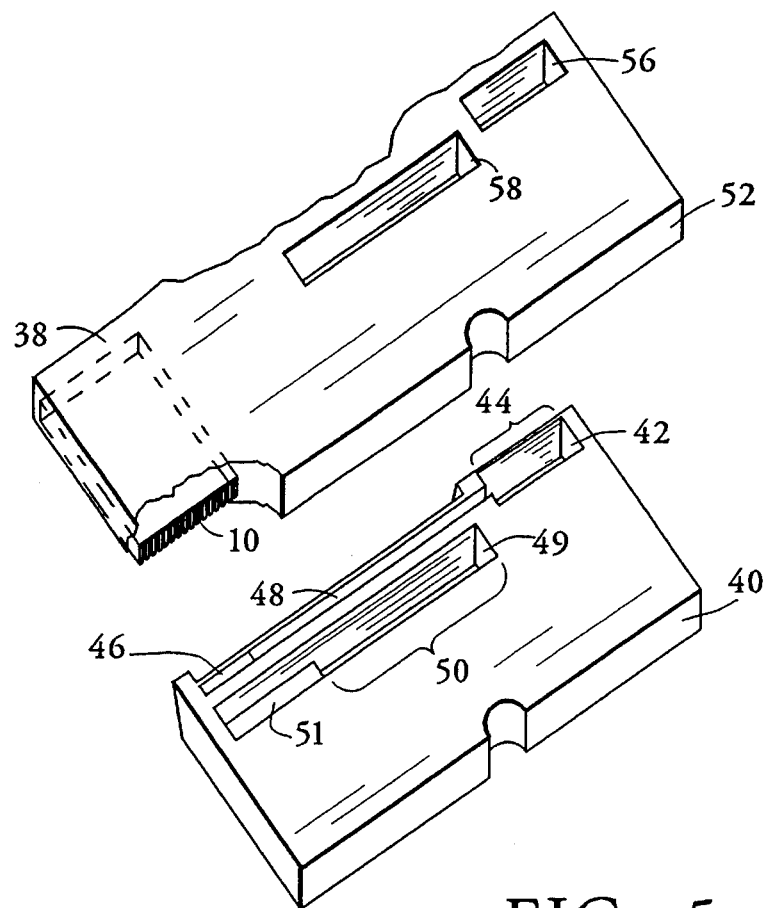
FIG. 5 is an exploded perspective view of an alternate embodiment of a heat dissipation apparatus in accord with the present invention.

Referring now to FIG. 5, an exploded perspective view of another preferred embodiment of the heat dissipation apparatus of the present invention is shown. A substrate 40, such as a silicon slice, has passageways 42 and 49 formed therein. Although silicon is used as the substrate in the preferred embodiment, any other well known substrate material would be suitable. Furthermore, although a thermally conductive substrate, silicon, is used in the preferred embodiment, substrate 40 may be formed of a non-thermally conductive material as well.

Passageways 42 and 49 may be formed into substrate 40 using a KOH etch, or any of the numerous etching or carving techniques well known in the art. Although passageways 42 and 49 are rectangularly shaped in the preferred embodiment, alternate shapes are also suitable with the methods of the present invention. Passageway 42, which functions as an inlet passageway, has a wide opening 44 at one end which passes completely through the bottom of substrate 40, and a capillary structure 46 at the other end.

Capillary structure 46 at one end of inlet passageway 42, is formed by carving a plurality of narrow channels into the top surface of substrate 40 which extend into but do not pass completely through substrate 40, the channels being approximately parallel to and in communication with passageway 42. The partitions of the substrate material, defining the narrow channels, are separated by distances which are sufficiently narrow such that a liquid may be maintained within region 46 through capillary action. Furthermore, because capillary structure 46 is used to hold liquid coolant through capillary action, and the rest of passageway 42 is used to deliver coolant, the narrow channels forming capillary structure 46 are much narrower than the channels used to form the rest of inlet passageway 42. The two ends of inlet passageway 42, wide opening 44 and capillary structure 46, are connected to each other through a slender channel 48 which, like the capillary structure 46 of passageway 42 does not pass completely through substrate 40. Slender channel 48 is formed of a single channel which is much larger than the channels used to form capillary structure 46.

Passageway 49, which is used as an outlet passageway, is formed in a manner similar to the way in which inlet passageway 42 was formed. Outlet passageway 49 has a wide opening 50 which is formed by carving an opening completely through substrate 40. Wide opening 50 is in communication with channel 51 of passageway 49. Channel 51, unlike opening 50, does not pass completely through substrate 40.

Outlet passageway 49 is formed having a much larger volume than inlet passageway 42. The larger volume of passageway 49 is necessary to accommodate the flow of vaporized coolant through outlet passageway 49. Because the coolant in a vaporized state occupies a larger volume than liquid coolant, outlet passageway 49 may be formed having a volume 100 times greater than the volume of inlet passageway 42.

Additional inlet and outlet passageways 42 and 49 may be formed periodically across the substrate 40 in order to ensure that a plentiful supply of coolant flows to the microchannel array, and to insure that vapor is quickly removed. For example, two inlet passageways may be formed on substrate 40, and located such that one inlet passageway resides one each side of outlet passageway 49. Additionally, although opening 44 of inlet passageway 42 and opening 50 of outlet passageway 49 are formed through the bottom of substrate 40, openings 44 and 50 could be arranged differently if so desired. Additionally the size of openings 44 and 50 may be increased in size in order to allow an increased flow of liquid coolant and vapor, respectively.

A second substrate 52, which is formed of a thermally conductive substrate such as silicon, has, on its surface, a region 38 heated by a heat producing device, not shown. Although the second substrate is formed of silicon in the preferred embodiment of the present invention, any one of numerous thermally conductive substrates well known in the art would be suitable. The second substrate 52 also has an array of microchannels 10 formed therein. The microchannel array 10 is formed within substrate 52 in a similar manner to which capillary structure 46 of inlet passageway 42 was formed. Channels are carved into the bottom of substrate 52 in the area under the heated region 38. The channels extend upward into the substrate 52 but do not reach the top surface. The sidewalls of the silicon substrate 52, which define the narrow channels, are separated by distances which are sufficiently narrow such that a liquid may be disposed within the microchannel array 10 near heated region 38 through capillary action. The channels used to form microchannel array 10 are carved such that they are aligned perpendicular to the channels used to form capillary structure 46 of inlet passageway 42. In so doing, the liquid coolant will tend to spread along the microchannel array 10 in a direction perpendicular to inlet passageway 42. Although only a single microchannel array 10 is present in the preferred embodiment of the present invention, a plurality of microchannel arrays 10 may be formed within substrate 52.

Substrate 52 is then bonded to the top of substrate 40 such that the region of capillary structure 46 of inlet passageway 42, and the portion of channel 51 of outlet passageway 49, proximate to capillary structure 46 of inlet passageway 42, are in fluid communication with microchannel array 10 of substrate 52. The two substrates 40 and 52 may be fusion bonded, or joined through any other well known silicon processing technique. Further, when the substrates 40 and 52 are both formed of silicon, the flat spot commonly formed into silicon wafers may be used to precisely align the two substrates.

Liquid coolant is supplied and pumped through external means, not shown, to the opening 44 of inlet passageway 42. The coolant travels through slender channel 48 and is received by capillary structure 46. Capillary structure 46 holds the coolant through capillary action and, in so doing, acts to regulate the flow of coolant from inlet passageway 42 into microchannel array 10. The liquid then spreads out along the channels of microchannel array 10 and is retained therein through capillary action. Although a pump is used to supply liquid coolant to inlet passageway 42 in the preferred embodiment of the present invention, other suitable supply means such as capillary action may also be used to supply coolant to inlet passageway 42. Whether a pump or capillary action is used to supply coolant to microchannel array 10 is dependent upon several factors. These factors may include the type of coolant used, the size of the microchannel array and the channels formed therein, and the amount of heat transferred into microchannel array 10. If the demand for fresh coolant exceeds the rate at which coolant can be introduced into the microchannel array 10 through capillary action, then a pump may be required.

The liquid coolant which is retained within the channels of microchannel array 10 is surrounded on three sides, such that the liquid coolant is held in close proximity to the heated region 38. That is, the liquid coolant is in contact with the top and the sidewalls of the channels only. Therefore, the liquid coolant is disposed within the channels such that one surface of the liquid coolant is exposed.

Excess heat generated by a device, not shown, and conductively transferred to heated region 38, heats and vaporizes the coolant which is held within the capillary structure of microchannel array 10. As the coolant is vaporized, fresh coolant is supplied to microchannel array 10 through inlet passageway 42 through a pump, not shown. The pressure gradient created by the flow of additional liquid coolant into microchannel array 10 causes the vaporized coolant passed from the exposed side of the liquid coolant to be vented through outlet passageway 49. In this manner, the flow of fresh liquid coolant into microchannel array 10 through inlet passageway 42 is not impeded by the vaporized coolant produced by the coolant residing in the channels of microchannel array 10. Likewise, the flow of vaporized coolant through outlet passageway 49 is unimpeded by the flow of liquid coolant into microchannel array 10 through inlet passageway 42. Furthermore, by venting the vaporized coolant through an outlet passageway 49 which is completely separate from an inlet passageway 42, the present invention does impede or dry out the path through which the incoming liquid coolant must flow.

In order to facilitate the removal of vapor, outlet passageway 49 may be maintained at a pressure less than inlet passageway 42 through external means. This may provide additional cooling due to expansion of the gaseous coolant 21 according to well known gas laws. The vapor exhausted through outlet passageway 49, may be vented into the atmosphere, or passed through a condenser where it may be condensed and recirculated to inlet passageway 42. Although outlet passageway 49 of the preferred embodiment is formed having a wide opening 50 in communication with a channel 51, alternate designs are possible. For example, an outlet passageway may be formed having only a single opening which, like opening 50 of outlet passageway 49, extends completely through substrate 40. The opening is then located such that when substrates 40 and 52 are bonded together, the opening is located directly under microchannel array 10. As coolant is vaporized in microchannel array 10, the vapor passes through the opening in substrate 40 and into a condenser or is vented to the atmosphere.

Thus, as heat is conductively transferred into the liquid coolant and the coolant is heated, vaporization occurs at the exposed surface of the coolant. By passing from the exposed surface of the liquid coolant and out of the channels, the vaporized coolant does not continue to flow along with the liquid coolant through the channels. Thus, the vaporized coolant does not tend to dry out the channels of the microchannel array 10 or cause the temperature of the heated region 38 to rise as found in prior cooling systems.

Additional openings 56 and 58 may also be formed through substrate 52, when a stacked arrangement of substrates is desired. Opening 56 is arranged such that when substrates 40 and 52 are bonded together, opening 56 will reside directly over opening 44 of inlet passageway 50. Likewise, opening 58 is arranged such that it will reside directly over opening 50 of outlet passageway 49.

Figure 6:
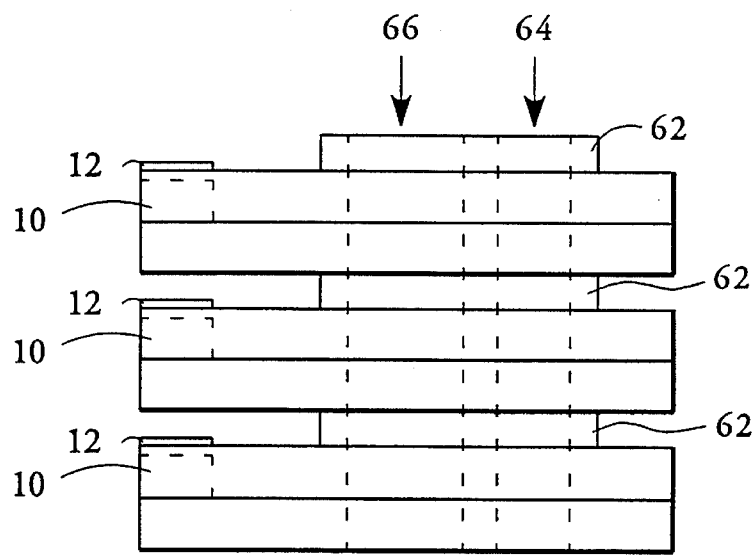
FIG. 6 is an elevated side view of the heat dissipation apparatus of FIG. 2 shown in a stacked and bonded array in accord with the present invention.

Referring now to FIG. 6, as successive substrate layers are stacked vertically, an elastomer gasket 62 having openings corresponding to openings 56 and 58 is placed between each assembly. In so doing, liquid coolant can be supplied to the microchannel array in each layer, and the vapor can be removed from each layer through common corridors 64 and 66 corresponding to openings 56 and 58, respectively. Microchannels 10 are located proximate to heat sources 12, which may be laser diode bars. Thus, the cooling apparatus is suitable for either a single layered substrate system as shown in FIG. 5, or for multi-layered stacked systems as shown in FIG. 6. Furthermore, both of the above heat removal systems function using only a single external pumping/supply means and a single venting means.

Figure 7:
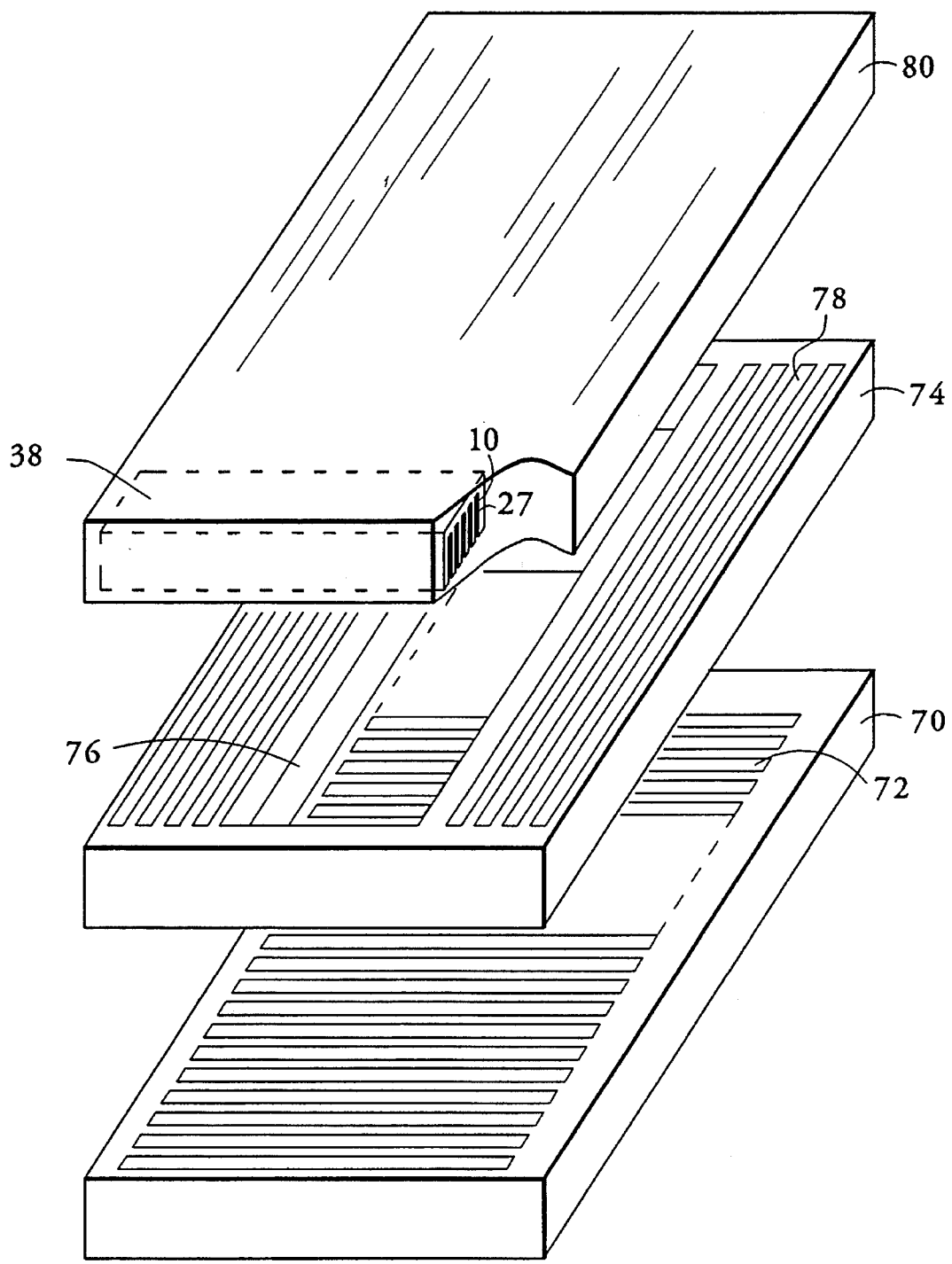
FIG. 7 is an exploded perspective view of another alternate embodiment of a heat dissipation apparatus in accord with the present invention.

With reference now to FIG. 7, an alternate embodiment of the present invention is shown in which a bottom substrate layer 70 is attached to a conventional heat sink, not shown. Narrow channels are formed into a large portion of the surface of substrate 70. The sidewalls 72 of the substrate material define the narrow channels as in the above-described preferred embodiment. The sidewalls 72 in the substrate 70 are separated by distances which are sufficiently narrow such that a liquid may be maintained therebetween through capillary action.

A middle substrate layer 74 has a central opening 76, and a series of narrow channels carved therethrough. The channels are carved into substrate 74, such that a capillary structure 78, as described above, is formed around opening 76 in a direction perpendicular to the alignment of sidewalls 72 in substrate 70.

A top substrate layer 80, having a heated region 38 residing on its top surface, is also shown in FIG. 4. Channels are carved into the bottom of substrate 80 in the area directly under the heated region 38. The channels extend into the substrate 80 but do not reach the top surface. The sidewalls 27 of the substrate material define the microchannels 10. The sidewalls 27 are separated by distances which are sufficiently narrow such that a liquid may be maintained therebetween through capillary action. The capillary pressure will tend to keep the liquid coolant in between the sidewalls 27, and the coolant will spread out along the microchannels 10 in a direction perpendicular to the sidewalls 78 formed in substrate 74.

A liquid coolant is introduced to the system, and the substrate layers 70, 74, and 80, are bonded together such that the liquid coolant is contained between the layers 70, 74, and 80, and such that the sidewalls of adjacent layers are in fluid communication. The capillary action existing between sidewalls 72, 78, and 27 of layers 70, 74, and 80, respectively, will supply liquid coolant into the area under the heated region 38 on top of layer 80. As excess heat is generated by the device, not shown, and transferred to the heated region, coolant contained between sidewalls 27 will be vaporized. The vaporized coolant will eventually flow from the microchannels 10 of layer 80, pass through the opening 76 in layer 74, and contact sidewalls 72 of layer 70. Since layer 70 is mounted to a heat sink, not shown, the sidewalls 72 will be maintained at a lower temperature than sidewalls 27. As a result, the vapor will condense onto sidewalls 72 into liquid coolant which can again be supplied through capillary action to microchannels 10 of layer 80 for additional cooling. Thus, a self-contained and fully enclosed system for cooling a heated region is disclosed which requires no external pumping, supplying, or venting means.

Figure 8:
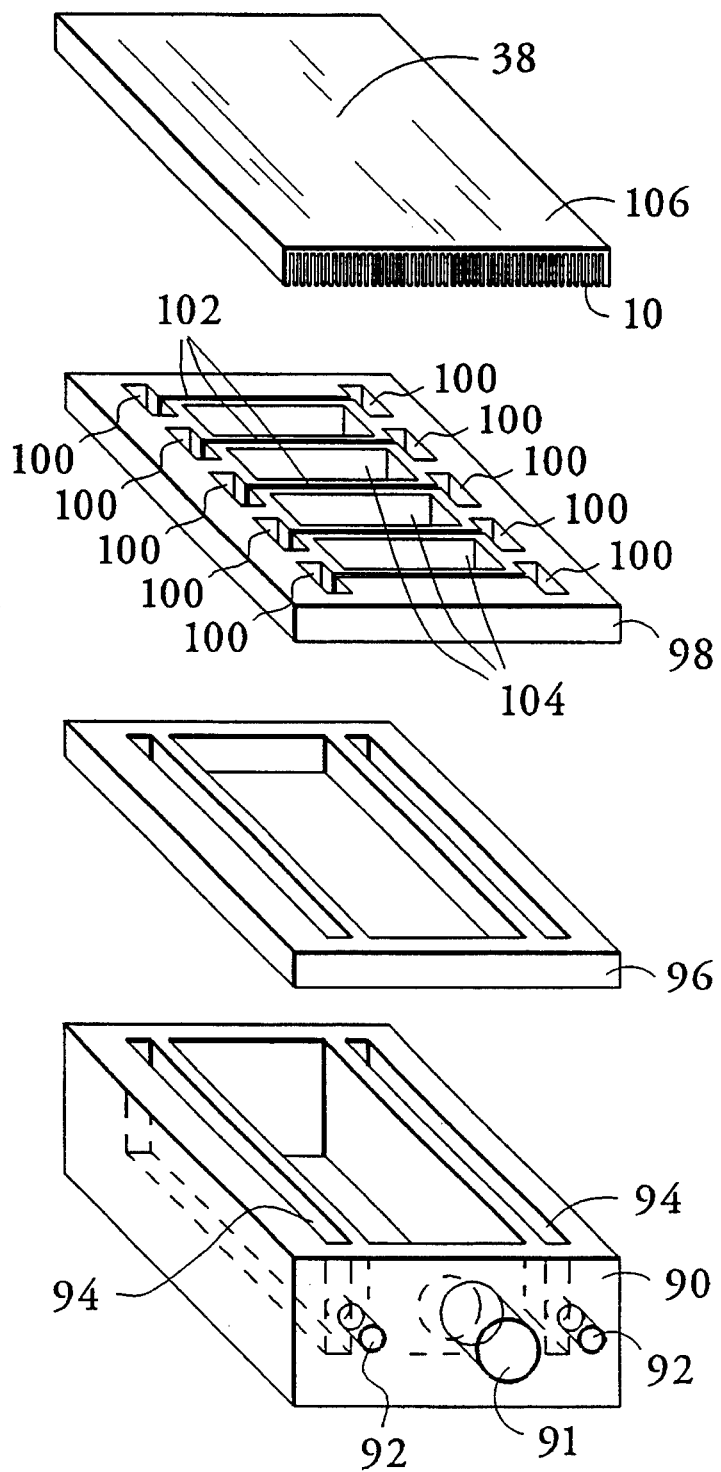
FIG. 8 is an exploded perspective view of yet another alternate embodiment of a heat dissipation apparatus in accord with the present invention.

Referring now to FIG. 8, an exploded view of another alternate embodiment of the present invention is shown. In this embodiment, liquid coolant enters housing 90 at input ports 92. The coolant is pumped through openings 94 in housings 90. An elastomer gasket 96 having openings corresponding to inlet openings 94 of housing 90 seals plate 98 to housing 90. Plate 98 has inlet passageways 100 which are on opposite sides of and in fluid communication with narrow grooves 102. Plate 98 also has exhaust openings 104 located in between narrow grooves 102. Coolant pumped upwards through inlet openings 94 passes through inlet passageways 100, and into narrow grooves 102. Coolant in narrow grooves 102 comes into contact with microchannels 10 formed into layer 106. The microchannels 10 of layer 106 is formed in the same manner as previous capillary structures described in detail above.

Excess heat generated by devices, not shown, and transferred to heated region 38 at or near the top surface of layer 106 heats and vaporizes the coolant maintained in microchannels 10. The vapor is then forced by pressure differences from the microchannels 10, through exhaust openings 104 and elastomer gasket 96 to outlet port 91 of housing 90.

We claim:

1. A thermal regulation device for cooling a heated region comprising:

a liquid coolant, a heat conductive body disposed in heat transfer relation relative to said heated region, said body having a wall defining an elongated microchannel within said body proximate to said heated region having an inlet end and an opening extending lengthwise and facing away from said heated region, with said liquid coolant disposed within said microchannel, wall dimensions of said microchannel inducing capillary flow of said liquid coolant and inducing formation of a meniscus by said liquid coolant near said opening, said wall dimensions and meniscus restraining said liquid coolant from boiling but allowing a liquid coolant phase change from a liquid to a gas phase near said opening, a means for supplying said liquid coolant to said inlet end, and a means for discharging gaseous coolant formed by said liquid coolant phase change from near said opening, thereby removing heat from said microchannel.

2. The device of claim 1 wherein said means for discharging gaseous coolant includes a chamber adjoining and in gaseous communication with said opening, said chamber having a gas pressure lower than that near said opening, whereby additional heat is removed from said microchannel due to expansion of said gaseous coolant.

3. The device of claim 1 further defined by means for enhancing liquid coolant flow, thereby removing heat from said microchannel.

4. The device of claim 2 wherein said means for discharging gaseous coolant further includes a condenser in thermal communication with said chamber, said condenser having a temperature inducing condensation of said gaseous coolant at said gas pressure of said chamber.

5. The device of claim 2 wherein said chamber has a gas pressure corresponding to a boiling point temperature in said coolant for which a small increase in said pressure results in a relatively large increase in said boiling point temperature.

6. The device of claim 2 wherein said means for supplying said liquid coolant to said inlet end includes a capillary having one end in fluid communication with said inlet end and another end disposed in said chamber adjacent to said condenser, whereby condensed coolant is drawn by said capillary to feed said microchannel.

7. The device of claim 1 wherein said microchannel is further defined by an end wall and a pair of sidewalls, said end wall proximate to said heated region and covered with liquid coolant, said sidewalls contiguous with said end wall and said opening.

8. The device of claim 7 wherein said sidewalls are substantially parallel with each other.

9. The device of claim 7 wherein said sidewalls are closer together near said end wall than near said opening.

10. The device of claim 7 wherein said sidewalls are closer together near said opening than near said end wall.

11. The device of claim 1 having a plurality of inlet ends separated by said opening.

12. The device of claim 2 wherein said means for supplying said liquid coolant to said inlet end includes a fluid pump having an outlet in fluid communication with said inlet end of said microchannel.

13. The device of claim 1 wherein said liquid coolant has a low viscosity, a high surface tension and a high heat of vaporization.

14. The device of claim 2 wherein said means for discharging gaseous coolant further includes a gas pump in gas flow communication with said chamber.

15. The device of claim 4 wherein said means for supplying said liquid coolant to said inlet end includes a conduit having one end in fluid communication with said inlet end and another end disposed in said chamber adjacent to said condenser and at a higher gravitational potential than said inlet end, whereby condensed coolant flows down said conduit to feed said microchannel.

16. A device for cooling a heated region comprising:

a liquid coolant, a heat conductive substrate disposed in heat exchange communication with said heated region, said substrate having walls defining a plurality of mostly parallel elongated microchannels proximate to said heated region having inlet ends and outlet openings extending longitudinally and facing away from said heated region with said liquid coolant disposed within said microchannels, wall dimensions of said microchannels inducing capillary action in said liquid coolant and inducing formation of meniscuses by said liquid coolant near said openings, said wall dimensions restraining said liquid coolant from boiling but allowing a liquid coolant phase change from a liquid to a gas phase near said meniscuses, a means for supplying said liquid coolant to said inlet ends, and a means for discharging said gaseous coolant from near said outlet openings, thereby removing heat from said microchannels.

17. The device of claim 16 wherein said means for discharging gaseous coolant includes a chamber adjoining and in gaseous communication with said outlet openings, said chamber having a gas pressure lower than that near said outlet openings, whereby additional heat is removed from said microchannels due to expansion of said gaseous coolant.

18. The device of claim 17 further comprising a second substrate bonded to said thermally conductive substrate, said second substrate having an inlet passageway with a first and second end formed therein, and an outlet passageway with a first and second end formed therein, said first end of said outlet passageway including said chamber.

19. The device of claim 18 wherein said means for supplying said liquid coolant to said inlet ends includes a plurality of capillaries disposed in said first end of said inlet passageway in fluid communication with said inlet ends.

20. The device of claim 19 wherein said means for discharging said gaseous coolant from said outlet openings includes a condenser adjoining said second substrate in thermal communication with said outlet passageway, said condenser having a temperature inducing condensation of said gaseous coolant at said gas pressure of said chamber.

21. The device of claim 20 wherein said means for supplying said liquid coolant to said inlet end includes said second end of said outlet passageway being disposed adjacent to and in fluid communication with said second end of said inlet passageway.

22. The device of claim 18 wherein said second substrate has an inlet bore extending therethrough and in fluid communication with said inlet passageway, and an outlet bore extending therethrough and in gaseous communication with said outlet passageway, such that liquid coolant may be introduced into said inlet passageway and gaseous coolant may be removed from said outlet passageway from outside said substrate.

23. The device of claim 22 disposed adjacent to a plurality of identical devices wherein corresponding inlet bores are in fluid communication with each other and corresponding outlet bores are in gaseous communication with each other.

24. The devices of claim 23, wherein said means for supplying liquid coolant to said inlet end further comprises a source of liquid coolant disposed outside said devices and in communication with said inlet bores.

25. The devices of claim 24 wherein said means for discharging gaseous coolant from said outlet openings further comprises a repository of gaseous coolant disposed outside said devices and in gaseous communication with said outlet bores.

26. The devices of claim 25 wherein the means for supplying said liquid coolant to said inlet end includes a fluid pump in communication with said source of liquid coolant.

27. The devices of claim 26 wherein the means for discharging said gaseous coolant from said outlet openings includes a gas pump in gaseous communication with said repository of gaseous coolant.

28. The devices of claim 27 wherein said means for supplying said liquid coolant to said inlet ends and said means for discharging said gaseous coolant from said outlet openings includes a condenser in thermal communication with said gaseous repository and having a temperature inducing condensation of said gaseous coolant disposed within said gaseous repository, said gaseous repository being in fluid communication with said source of liquid coolant.

29. The device of claim 17 wherein said liquid coolant has a low viscosity, a high surface tension and a high heat of vaporization.

30. A device for cooling an electronic apparatus comprising:

a liquid coolant, a thermally conductive body having a surface in heat exchange communication with said electronic apparatus and having a plurality of thin walls protruding in a direction generally away from said surface, said walls defining at least one elongated microchannel having an inlet and having an opening extending lengthwise facing away from said surface, said wall dimensions of said microchannel inducing capillary action in said coolant and inducing formation of a meniscus by the coolant near the opening, said liquid coolant vaporizing at said meniscus due to heat from said body, but constrained from boiling by said meniscus and said walls, a pressure means for supplying said liquid coolant to said inlet, and a venting means for removing gaseous coolant from said opening.

31. The device of claim 30 wherein said venting means includes a chamber adjoining and in gaseous communication with said opening, said chamber having a gas pressure lower than that adjacent to said meniscus, whereby additional cooling occurs due to expansion of said gas.

32. The device of claim 31 further comprising a condenser in gas flow communication with said chamber, said condenser having a temperature inducing condensation of said gaseous coolant at said gas pressure of said chamber.

33. The device of claim 32 wherein said pressure means includes a capillary having one end in fluid communication with said inlet and another end in fluid communication with coolant condensed by said condenser, whereby condensed coolant is drawn by said capillary to feed said microchannel.

34. A thermal regulation device for cooling a heated region comprising:

a liquid coolant, a heat conductive body disposed in heat transfer relation relative to said heated region, said body having a wall defining an elongated microchannel within said body proximate to said heated region having a pair of inlet ends and an opening extending lengthwise therebetween distal to said heated region, with said liquid coolant disposed within said microchannel, wall dimensions of said microchannel inducing capillary flow of said liquid coolant and inducing formation of a meniscus by said liquid coolant near said opening, said wall dimensions and meniscus restraining said liquid coolant from boiling but allowing a liquid coolant phase change from a liquid to a gas phase near said opening, a means for supplying said liquid coolant to said pair of inlet ends, and a means for discharging gaseous coolant formed by said liquid coolant phase change from near said opening, thereby removing heat from said microchannel.

* * * * *